United States Patent [19]
D'Angelo et al.

[11] Patent Number: 6,005,378
[45] Date of Patent: Dec. 21, 1999

[54] COMPACT LOW DROPOUT VOLTAGE REGULATOR USING ENHANCEMENT AND DEPLETION MODE MOS TRANSISTORS

[75] Inventors: Kevin P. D'Angelo, Santa Clara; Robert S. Wrathall, Scotts Valley, both of Calif.

[73] Assignee: Impala Linear Corporation, Sunnyvale, Calif.

[21] Appl. No.: 09/035,683

[22] Filed: Mar. 5, 1998

[51] Int. Cl.$^6$ ........................................................ G05F 3/16
[52] U.S. Cl. ............................................. 323/313; 323/273
[58] Field of Search ................................. 323/273, 274, 323/280, 278, 303, 313, 281

[56] References Cited

U.S. PATENT DOCUMENTS

| | | | |
|---|---|---|---|
| 4,779,037 | 10/1988 | LoCascio | 323/275 |
| 4,906,913 | 3/1990 | Stanojevic | 323/303 |
| 4,928,056 | 5/1990 | Pease | 323/314 |
| 5,066,901 | 11/1991 | Cheah et al. | 323/267 |
| 5,168,209 | 12/1992 | Thiel | 323/313 |
| 5,274,323 | 12/1993 | Dobkin et al. | 323/280 |
| 5,334,928 | 8/1994 | Dobkin et al. | 323/280 |
| 5,539,603 | 7/1996 | Bingham | 361/56 |
| 5,563,501 | 10/1996 | Chan | 323/282 |

*Primary Examiner*—Adolf Deneke Berhane
*Attorney, Agent, or Firm*—Law Offices of Terry McHugh; Thomas H. Ham; Terry McHugh

[57] ABSTRACT

A low dropout (LDO) voltage regulator for generating a well-regulated voltage which is stable with variations in load resistance and in supply voltage includes a non-complex reference voltage generator. In the preferred embodiment, the reference voltage generator is configured to function as an amplifier as well as a reference voltage generator. In one embodiment, a single gain stage LDO voltage regulator utilizes the single function reference voltage generator which is compared to a feedback voltage that is proportional to an output voltage. The feedback voltage and the reference voltage control two currents which are used to generate a control signal to a pass transistor. Depending on the supply voltage, the pass transistor either increases or decreases the current to an output terminal to raise or lower the output voltage until the output voltage equals the regulated voltage. In another embodiment, a two gain stage LDO voltage regulator utilizes the dual function reference voltage generator. The two gain stage LDO voltage regulator compares a gained signal instead of the reference voltage with the feedback voltage to generate the control signal to the pass transistor.

18 Claims, 3 Drawing Sheets

COMPACT LOW DROPOUT VOLTAGE REGULATOR USING ENHANCEMENT AND DEPLETION MODE MOS TRANSISTORS

TECHNICAL FIELD

The invention relates generally to voltage regulators and more particularly to low dropout voltage regulators.

DESCRIPTION OF THE RELATED ART

Cellular phones, laptop computers, and other battery-powered electronic devices have a number of requirements relating to voltage regulation. These devices require a stable supply voltage to function properly. However, the supply voltage can vary according to changes in load resistance. In addition, the supply voltage of a battery tends to drop as the battery ages.

A voltage regulator is used to generate a voltage output with a low susceptibility to variations in a load resistance or a supply voltage by forming a feedback signal that varies in response to variations in the supply voltage. A low dropout (LDO) voltage regulator is a special voltage regulator in which the regulated voltage can be maintained even when the supply voltage drops very close to the desired voltage. Requirements for an exemplary LDO voltage regulator are temperature independence, a quick response to transients, and a low output impedance.

A typical LDO voltage regulator utilizes the operation of a pass transistor, which is either a bipolar transistor, or a metal-oxide semiconductor (MOS) transistor that delivers the variable current to an output terminal according to the load requirements. The pass transistor is usually controlled by an error amplifier which generates a signal according to the difference between a reference voltage and a feedback voltage. A voltage divider may be used to supply the feedback voltage to the error amplifier. The feedback voltage is proportional to an output voltage such that when the output voltage equals the regulated voltage, the feedback voltage equals the reference voltage. In some LDO regulators, the reference voltage is generated utilizing a bandgap reference voltage circuit.

There are two broad categories of approaches to designing LDO regulators, bipolar technology and MOS technology. The traditional approach is to use bipolar technology. In general, a bipolar circuit has higher gain and higher speed than circuits that are designed using MOS technology. However, the bipolar circuits are typically more expensive and are larger. Another concern is that bipolar circuits have a relatively high ground leg current. MOS circuits, on the other hand, are typically smaller and have lower quiescent and ground leg currents. The concern with the MOS approach is that the circuits may have a slower response to transients.

U.S. Pat. No. 5,168,209 to Thiel V describes a LDO voltage regulator that utilizes the bipolar approach. The Thiel V regulator includes a PNP pass transistor, a reference voltage generator, a gain circuit, and a current limit circuit. The reference voltage utilizes bandgap technology. The Thiel V regulator contains seventeen bipolar transistors, three current sources, eight resistors, and a capacitor.

Another patent which describes a voltage regulator of interest is U.S. Pat. No. 4,928,056 to Pease. The Pease regulator utilizes CMOS technology and includes a PMOS pass transistor, a shunt PMOS transistor, a reference voltage generator, and two op-amps. Again, bandgap technology is utilized to generate the reference voltage. The Pease regulator contains thirteen MOS transistors, four parasitic bipolar transistors, three current sources, nine resistors, and two capacitors.

U.S. Pat. No. 5,539,603 to Bingham describes another LDO voltage regulator utilizing MOS technology. The Bingham regulator includes a pass transistor, a current limit circuit, and an error amplifier. However, the Bingham regulator does not disclose any particular type of reference voltage generator. Without the reference voltage generator, the Bingham regulator contains eighteen MOS transistors, two bipolar transistors, and a resistor.

While the known LDO voltage regulators operate well for their intended purpose, a compact and cost-efficient LDO voltage regulator with excellent performance is desired. What is needed is a LDO voltage regulator that performs as well as or better than the known LDO voltage regulators with fewer devices.

SUMMARY OF THE INVENTION

A circuit for generating a well-regulated voltage which is stable with variations in load resistance and supply voltage includes a non-complex reference voltage generator. In the preferred embodiment, the reference voltage generator is configured to function as an amplifier, as well as a reference voltage.

The reference voltage generator is created by connecting a depletion mode MOS transistor and an enhancement mode MOS transistor in series. The depletion mode transistor is configured as a current source, while the enhancement mode MOS transistor is configured as a diode. This configuration yields a stable reference voltage across the enhancement mode MOS transistor. By configuring the reference voltage generator in such a manner, the regulated voltage can be determined by the dimensions of the two transistors. When the two transistors have the same dimensions, physics dictates that the reference voltage will approximately equal the sum of the magnitude of the depletion threshold and the enhancement threshold.

In the preferred embodiment, two cascode devices, a depletion mode MOS transistor and an enhancement mode MOS transistor, are added to the series connection to further isolate the reference voltage from externally induced voltage variations. Such isolation is achieved by the higher input impedance in the circuit provided by the additional devices, rendering the circuit less vulnerable to voltage changes in the supply voltage.

In some embodiments, additional cascode devices are introduced to the reference voltage generator. A number of enhancement mode MOS transistors and depletion mode MOS transistors are connected in a similar manner as the above-mentioned two cascode devices to generate a temperature stable reference voltage that is more independent of process parameters. The exact number of additional cascode devices is not crucial to the invention.

In the more preferred embodiment, the configuration of the above-described reference voltage generator is slightly changed to also act as an amplifier which can be used as a gain in more complex circuitry, such as a LDO voltage regulator. This is accomplished by changing the configuration of the enhancement mode MOS transistors to a common emitter configuration.

In one embodiment, the dual function reference voltage generator and amplifier circuit is utilized to create a two gain stage LDO voltage regulator. The dual function reference voltage generator and amplifier circuit is responsive to a feedback voltage which is proportional to an output voltage.

The difference in the feedback voltage and the reference voltage generates a first stage signal from the dual function reference voltage generator and amplifier circuit. The first stage signal is further compared with the reference voltage by a second stage circuit. The second stage sends a control signal to a pass transistor which raises or drops the output voltage to equal the regulated voltage.

In another embodiment, a single gain stage LDO voltage regulator utilizes the single function reference voltage generator instead of the dual function reference voltage generator and amplifier circuit. The single gain stage LDO voltage regulator differs from the two gain stage LDO voltage regulator in that the reference voltage generator of the single gain stage LDO voltage regulator functions only to generate the reference voltage, so that the first signal is the reference voltage. The rest of the first gain stage LDO voltage regulator operates in the same manner as the two gain stage LDO voltage regulator.

In the preferred embodiment, the single gain stage LDO voltage regulator also includes two stabilization paths. One stabilization path includes a capacitor and a resistor. The other path includes only a capacitor. The two stabilization paths work together to stabilize the single gain LDO voltage regulator.

An advantage of the invention is that fewer devices are needed to create either the single gain stage LDO voltage regulator or the two gain stage LDO voltage regulator. Requiring fewer devices decreases the cost to manufacture the invention. In addition, the present invention with fewer devices is less likely to malfunction as a result of a defect of one of the devices.

BRIEF DESCRIPTION OF THE DRAWINGS

FIG. 1b is a schematic diagram of a modified reference voltage generator circuit of FIG. 1a.

DETAILED DESCRIPTION

Figure 1C:
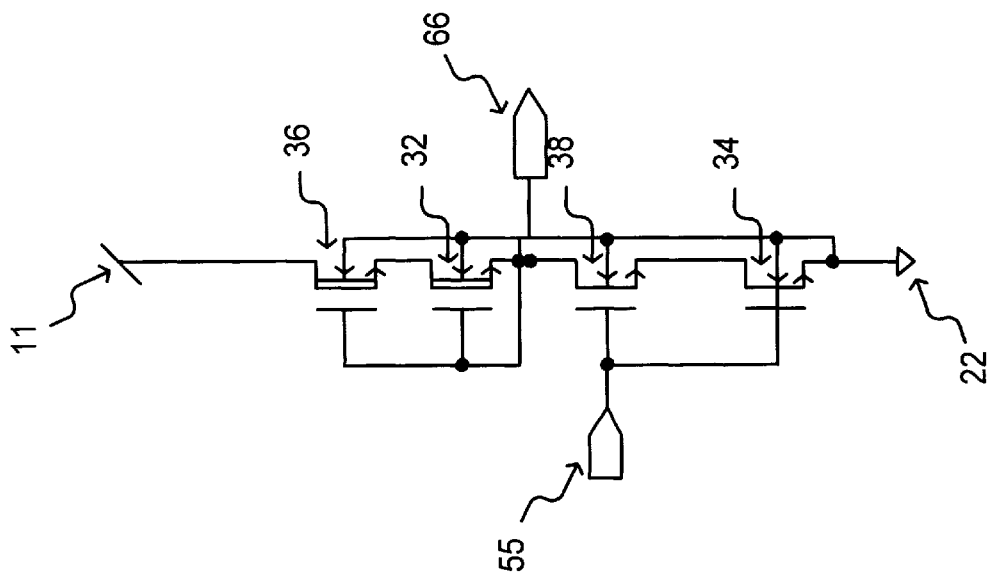
FIG. 1c is a schematic diagram of a dual function reference voltage generator and amplifier circuit in accordance with one embodiment of the invention.
Figure 1B:
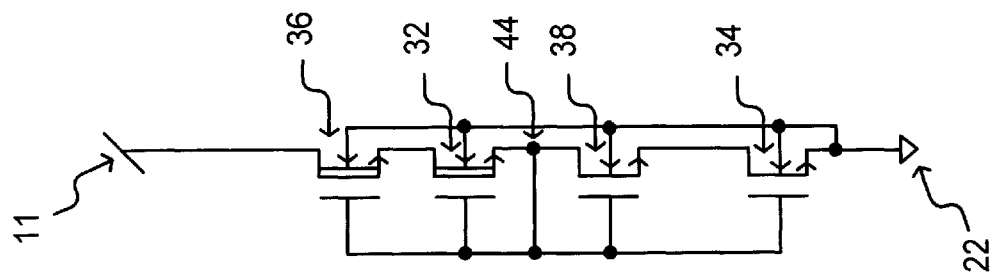
Figure 1A:
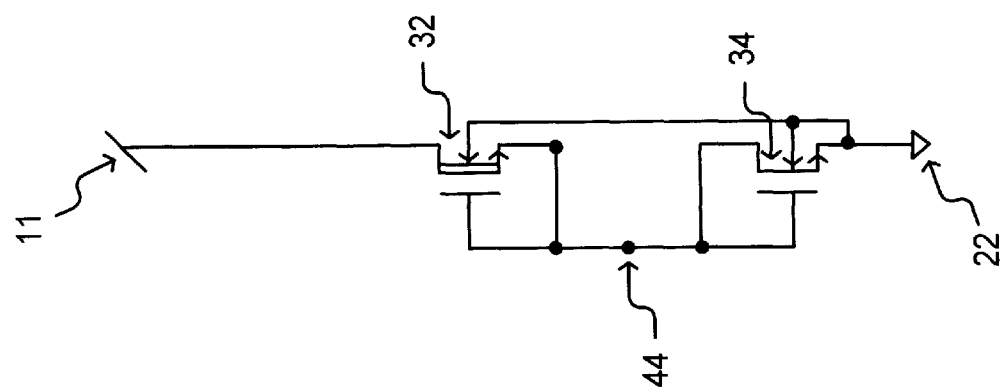
FIG. 1a is a schematic diagram of a reference voltage generator circuit utilizing a current source MOS transistor and a diode-configured MOS transistor.

With reference to FIG. 1a, a reference voltage generator circuit is shown as being connected to a high voltage node (Vin) 11 and a low voltage node (Gnd) 22. As an example, Vin may be a supply voltage which can vary from 1 volt to a few volts, Gnd may be electrical ground, and the desired reference voltage may be 0.9 volts. A depletion mode MOS transistor 32 and an enhancement mode MOS transistor 34 are connected in series. The enhancement mode MOS transistor 34 is connected in a diode configuration. The depletion mode MOS transistor 32 has a gate which is connected to its source and acts as a current source to the enhancement mode MOS transistor 34. A reference voltage appears at a reference node 44.

The value of the reference voltage can be calculated by solving a few equations. First, the current supplied to the enhancement mode MOS transistor 34 can be calculated by using the following equation for the depletion mode MOS transistor 32:

$$I_D = K'_D \frac{W_D}{L_D}(V_{gsD} - V_{tD}) = K'_D \frac{W_D}{L_D}(V_t)^2 \qquad \text{(Eqn. 1)}$$

where $I_D$ is the current supplied by the depletion mode MOS transistor, $K'_D$ is a constant, $W_D$ is the width, $L_D$ is the length, $V_{gs}$ is the voltage across the gate and the source, and $V_t$ is the threshold voltage.

The voltage across a gate and a source of the enhancement mode MOS transistor can be calculated by solving the following equations.

$$V_{gs_E} = V_{t_E} + \sqrt{\frac{I_E}{K'_E \frac{W_E}{L_E}}}$$

Since $I_E = I_D$, $I_E$ can be substituted using Eqn. 1. Then $$V_{gs_E} = V_{t_E} + \sqrt{\frac{K'_D \frac{W_D}{L_D}(V_{tD})^2}{K'_E \frac{W_E}{L_E}}}$$

Using $K' = \mu Cox$, where Cox is the capacitance across the gate oxide, the equation now becomes $$V_{gs_E} = V_{t_E} + \sqrt{\frac{\mu Cox_D \frac{W_D}{L_D}}{\mu Cox_E \frac{W_E}{L_E}}} \cdot V_{tD}$$

However, since the gate oxide regions of the two transistors 32 and 34 are simultaneously deposited and are substantially identical, $$\sqrt{\frac{\mu Cox_D}{\mu Cox_E}} \approx 1,$$

so that $$V_{gs_E} = V_{t_E} + \sqrt{\frac{W_D/L_D}{W_E/L_E}} \cdot V_{tD}$$

The reference voltage at node 44 equals the voltage across the gate and the source of the enhancement mode MOS transistor 34. Therefore, if the two transistors 32 and 34 have the same widths and lengths, the reference voltage equals the sum of the threshold votage of the depletion mode MOS transistor 32 plus the threshold voltage of the enhancement mode MOS transistor 34. Thus, the reference voltage is independent of the supply voltage.

One of the advantages of the configuration of the circuit of FIG. 1a is that by utilizing CMOS technology, the reference voltage is insensitive to gate oxide thickness of either transistor 32 or transistor 34. The reason is that the gates for both transistors 32 and 34 are dependent upon each other during fabrication. An increase or a decrease of size in one of the gates will be compensated by the size of the other gate.

Another advantage of this circuitry is that the sizes of the transistors 32 and 34 can be adjusted to give a near zero temperature coefficient voltage drop across the enhancement mode MOS transistor 34. For example, assuming the two transistors 32 and 34 are manufactured using an NWELL process with a grounded P-type substrate, the negative temperature coefficient of the threshold voltage is balanced by the negative temperature coefficient of the surface mobility of the NMOS channel. The body bias voltage in the depletion mode MOS transistor 32 is accounted for in this temperature coefficient balancing. In addition, the added temperature coefficient caused by the body contact at ground is balanced by the sizes and current densities of the transistors 32 and 34. The overall effect is that the circuit of FIG. 1a is substantially temperature insensitive.

PWELL process may also be utilized without adding complexity to the circuitry. If PWELL process is utilized, the body of the depletion mode MOS transistor 32 should be connected to its source.

FIG. 1b shows the circuit of FIG. 1a with two additional devices. Whenever applicable, the same reference numerals are used for the same devices shown in FIG. 1a. The two added devices are cascode transistors. A depletion mode MOS transistor 36 is connected in series between the Vin 11 and the depletion mode MOS transistor 32. An enhancement mode MOS transistor 38 is connected in series between the depletion mode MOS transistor 32 and the enhancement mode MOS transistor 34.

The cascode transistors 36 and 38 provide higher impedance in the circuit. Thus, the circuit is less vulnerable to voltage changes at Vin 11 and yields a more constant reference voltage. The cascode transistors 36 and 38 do not change the value of the reference voltage in respect to dc.

Although only two cascode devices are shown in FIG. 1b, reference voltage generators with additional cascode devices are contemplated. Multiple depletion mode MOS transistors can be connected in series between the depletion mode MOS transistor 32 and Vin 11. Similarly, multiple enhancement mode MOS transistors can be connected in series between the enhancement mode MOS transistor 34 and the depletion mode MOS transistor 32. The exact number of the additional depletion mode and enhancement mode MOS transistors is not crucial to the invention. The additional depletion mode and enhancement mode MOS transistors have the effect of modifying the temperature coefficient of the reference voltage. By adjusting the temperature coefficient, a temperature stable reference voltage can be obtained which is more independent of process parameters.

FIG. 1c shows the circuit of FIG. 1b with a minor change in configuration. Again, the same reference numerals are used for the same devices shown in prior figures. The only difference between the circuit of FIG. 1b and the circuit of FIG. 1c is that gates of the enhancement mode MOS transistors 34 and 38 are now connected to an input terminal 55. The reference node 44 is now shown as an output terminal 66. Thus, the diode configuration of the enhancement mode MOS transistor 34 is now changed to a common emitter configuration.

The changed configuration has modified the reference voltage regulator of FIG. 1b to an amplifier with a built-in offset to the reference voltage. The circuit now operates in a dual function mode. Depending upon the voltage applied to the input terminal with respect to the reference voltage, the voltage at the output terminal will vary with high gain.

The overall effect of the circuit of FIG. 1c will be described according to the change of voltage applied to the input terminal 55. When the input voltage is very small compared to the reference voltage, the output voltage is maintained at a constant high voltage. As the input voltage nears the reference voltage, the output voltage drops. As the input voltage continues to rise, the output voltage continues to drop until the output voltage reaches a low voltage point. The drop in the output voltage is fairly sharp, which represents the high gain of the circuit.

The operation of the circuit of FIG. 1c will now be described according to the overall effect. When the input voltage at terminal 55 equals the reference voltage, the output voltage at terminal 66 is equivalent to the reference voltage. However, when the input voltage is less than the reference voltage, less current will be drawn from the enhancement mode MOS transistors 34 and 38, yielding a high voltage at the output terminal 66. Conversely, when the input voltage is greater than the reference voltage, more current will be drawn from the enhancement mode MOS transistors 34 and 38, yielding a low voltage at the output terminal 66.

Figure 2:
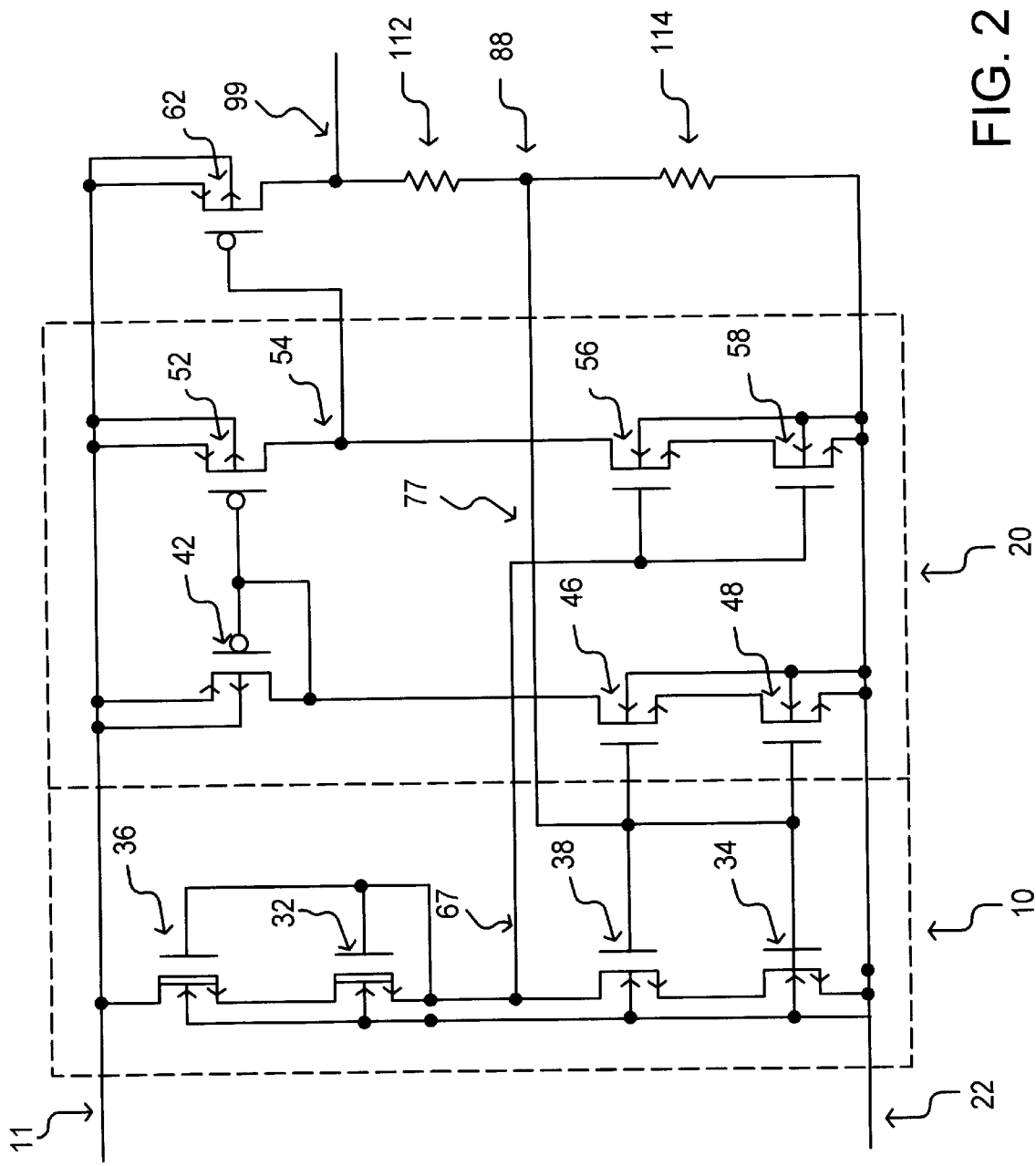
FIG. 2 is a schematic diagram of a low dropout voltage regulator utilizing the dual function reference voltage generator and amplifier circuit of FIG. 1c.

With reference to FIG. 2, a LDO voltage regulator is shown which utilizes the dual function reference voltage regulator and amplifier circuit of FIG. 1c. The same reference numerals are used for the same devices shown in FIG. 1c. The circuit shown in FIG. 2 is a two gain stage LDO voltage regulator.

A first stage 10 is the circuit of FIG. 1c. The devices in the first stage 10 are configured in the same manner as described above for FIG. 1c. However, the gates of the transistors 34 and 38 are now connected to a feedback line 77 instead of the input terminal 55.

As described above, the first stage 10 is a dual function circuit. The first stage 10 is an amplifier with a built-in reference voltage which is used to generate a first gain signal in response to the difference in a feedback voltage as compared to the reference voltage.

The feedback voltage is derived from a voltage divider which is shown as resistors 112 and 114. The resistors 112 and 114 are connected in series between an output terminal 99 and the Gnd 22. The electrical resistances of the resistors 112 and 114 are adjusted such that when the voltage at the output terminal 99 is a desired or a regulated voltage, the voltage at a feedback node 88 is equivalent to the built-in reference voltage.

A second stage 20 is shown as two current paths. A first current path consists of three MOS transistors 42, 46, and 48 which are connected in series. A second current path also consists of three MOS transistors 52, 56, and 58 which are connected in series. The transistors 42 and 52 form a current mirror. Gates of transistors 46 and 48 are coupled to the gates of transistors 34 and 38 and are connected to the feedback line 77. Gates of transistors 56 and 58 are connected to the first stage 10 to receive the first gain signal.

In the preferred embodiment, the transistors 38, 46, and 56 are all enhancement mode MOS transistors having the same dimensions. In addition, the transistors 34, 48, and 58 are also enhancement mode MOS transistors having the same dimensions. Lastly, the transistors 42 and 52 are PMOS transistors having the same dimensions. However, some applications may dictate the use of different dimensions.

The second stage 20 compares two currents that are determined by the first gain signal and the feedback voltage. Since the two current paths consist of same-sized devices, the two currents are equivalent when the voltage of the first gain signal along line 67 equals the feedback voltage along feedback line 77. However, differences between the two voltages will affect a second gain signal that appears at a control node 54. Depending on the difference between the first gain signal and the reference voltage, the voltage at the control node 54 will sharply rise or fall.

The control node 54 is connected to a pass transistor 62 which is shown as a PMOS transistor. The pass transistor 62 is connected in series between Vin 11 and the output terminal 99, such that a low impedance electrode, i.e. a source, is connected to Vin 11 and a high impedance electrode, i.e. a drain, is connected to the output terminal 99. Since the control node 54 is connected to a control electrode, i.e. a gate, of the pass transistor 62, the sharp rise or fall of the voltage at control node 54 will determine the amount of current that passes through the pass transistor 62, which in turn determines the voltage at the output terminal 99.

The operation of the LDO voltage regulator of FIG. 2 will be described according to undesired variations of the supply voltage at the Vin 11. At equilibrium, the supply voltage is fixed at some voltage. The voltage appearing at the output terminal 99 equals the desired or regulated voltage. When the regulated voltage appears at the output terminal 99, the voltage at the feedback node 88 equals the reference voltage. Since the voltage at the feedback node 88 equals the reference voltage, the reference voltage will appear at the gates of the transistors 34 and 38. As described above for the circuit of FIG. 1c, when the voltage at the gates of the transistors 34 and 38 equals the reference voltage, the voltage at the first stage output 67 also equals the reference voltage. The voltage at the first stage output 67 will appear at the gates of the transistors 56 and 58.

Since the feedback line 77 is also connected to the gates of the transistors 46 and 48, the voltage at the gates of the transistors 46 and 48 is equivalent to the reference voltage. The equivalent voltages at the gates of the transistors 46, 48, 56 and 58 cause the currents through both current paths of the second stage 20 to be equivalent. Thus, the voltage at the control node 54 remains stable. Since the voltage at the control node 54 has not changed, the pass transistor 62 is unaffected and the current through the pass transistor 62 is maintained. The unchanged current reflects the constant regulated voltage which will appear at the output terminal 99.

However, if the supply voltage rises due to some event such as a decrease in the load resistance, the circuit of FIG. 2 will respond to maintain the regulated voltage at the output terminal 99. Initially, the voltage at the output terminal will rise along with the voltage at the feedback loop node 88. The rise in the feedback voltage will be applied to transistors 34, 38, 46, and 48. The increase in the feedback voltage has two effects. First, the transistors 46 and 48 will pull more current, so that the current through the transistor 52 will increase. Second, the transistors 34 and 38 will also pull more current, causing the voltage at the first stage output 67 to drop. This drop in voltage will appear at the gates of the transistors 56 and 58, causing the transistors 56 and 58 to pull less current. The increase in current through the transistor 52 and the decrease in current through the transistors 56 and 58 have a push and pull effect on the control node 54. The net result is that the voltage at the control node 54 will rise sharply by the two gains caused by the first stage 10 and the second stage 20. The rise in voltage at the control node 54 causes voltage across the gate and the source of the pass transistor 62 to decrease, which in turn lowers the voltage at the output terminal 99 until the voltage equals the regulated voltage.

On the other hand, if the supply voltage drops, the same transistors described above operate in the opposite manner, decreasing the voltage at the control node 54 by causing the current through the transistor 52 to decrease while increasing the currents through the transistors 56 and 58. The voltage drop at the control node 54 causes the voltage across the gate and the source of the pass transistor 62 to increase, which in turn raises the voltage at the output terminal 99 until the voltage again equals the regulated voltage.

Figure 3:
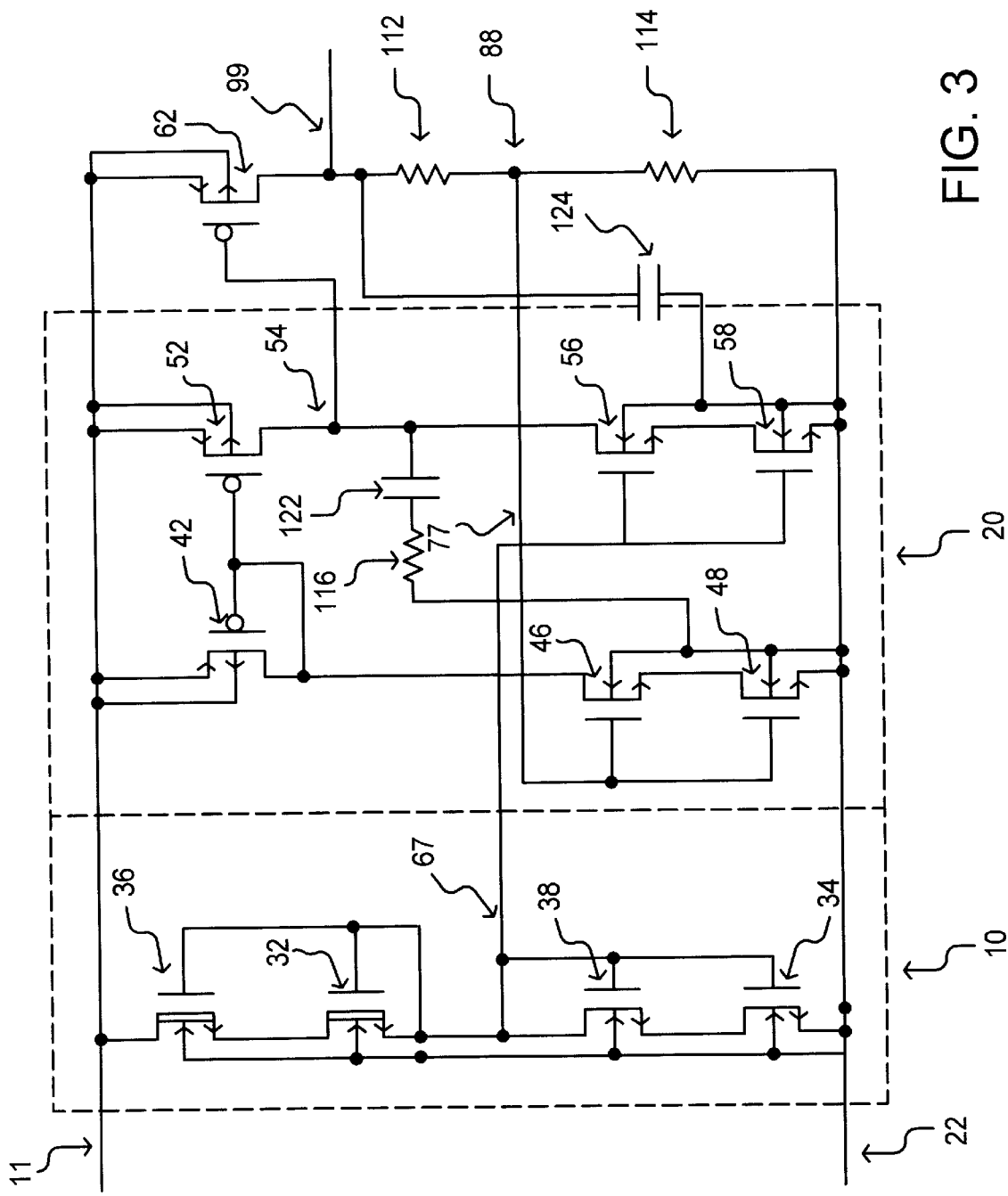
FIG. 3 is a schematic diagram of a low dropout voltage regulator utilizing the modified reference voltage generator circuit of FIG. 1b.

Referring now to FIG. 3, another embodiment of the invention is shown that utilizes the reference voltage generator of FIG. 1b. The circuit contains all of the devices of the regulator of FIG. 2 with minor changes in the configuration and the addition of two capacitors and a resistor for stabilization. Therefore, where applicable, the same reference numerals are used for the same devices shown in FIG. 2.

The first substantive difference in the regulator of FIG. 3 as compared to the regulator of FIG. 2 is that the gates of the transistors 34 and 38 are now connected to the first stage output 67, instead of being coupled to the gates of the transistors 46 and 48 and connected to the feedback line 77. This configuration eliminates the first gain of the circuit. Thus, the first stage 10 does not operate as a dual function circuit. Instead, the first stage 10 operates exclusively as a reference voltage regulator. However, the regulator of FIG. 3 operates similarly to the regulator of FIG. 2.

The other substantive difference is the addition of two stabilization paths. A first stabilization path consists of a resistor 116 and a capacitor 122 in series from the control node 54 to the source of the transistor 46. The other stabilization path consists of a capacitor 124 which is connected to the drain of the pass transistor 62 and the source of the transistor 56. In one embodiment, the capacitors 122 and 124 have values of 70 pf and 45 pf, respectively, and the resistor 116 has a value of 300 k.

As previously noted, the regulator of FIG. 3 operates essentially in the same manner as the regulator of FIG. 2. Again, the operation of the regulator of FIG. 3 will be described according to the variation of the supply voltage. At equilibrium, all the voltages are identical to the voltages as described above for the regulator of FIG. 2. Therefore, the regulator of FIG. 3 operates identically to the regulator of FIG. 2 and maintains the regulated voltage at the output terminal 99.

If the supply voltage rises, the current through the transistor 52 increases in the same manner as described above for the regulator of FIG. 2. However, the current through the transistors 56 and 58 is now fixed since the voltage at the first stage output 67 does not vary with respect to the supply voltage. The current decrease in the transistor 52 still causes the voltage at the control node 54 to rise. Therefore, the voltage at the output terminal 99 will decrease until it reaches the regulated voltage.

On the other hand, if the supply voltage drops, the current through the transistor 52 decreases. Again, the current through the transistors 56 and 58 remains constant. The decrease in current through the transistor 52 decreases the voltage at the control node 54. Therefore, the voltage at the output terminal 99 will increase until it reaches the regulated voltage.

What is claimed is:

1. A dual function reference voltage generator and amplifier circuit for generating an output signal that is responsive to differences between an input signal and reference voltage comprising:

a power source that includes a high voltage node and a low voltage node;

a voltage reference MOS transistor connected between said high voltage node and said low voltage node, said voltage reference MOS transistor having a gate connected to an input terminal to receive said input signal; and a current source means for providing a generally fixed current to said voltage reference MOS transistor, said current source means including a first depletion mode MOS transistor connected in series between said high voltage node and said voltage reference MOS transistor.

2. A circuit of claim 1 wherein said voltage reference MOS transistor is a first enhancement mode MOS transistor.

3. A circuit of claim 2 wherein said first depletion mode MOS transistor has a gate connected to its source.

4. A circuit of claim 3 further comprising at least one second depletion mode MOS transistor and at least one second enhancement mode MOS transistor, each said second depletion mode MOS transistor being connected in series between said high voltage node and said first depletion mode MOS transistor such that gates of all depletion mode MOS transistors are coupled, each said second enhancement mode MOS transistor being connected in series between said first depletion mode MOS transistor and said first enhancement mode MOS transistor such that gates of all enhancement mode MOS transistors are coupled.

5. A voltage regulator having an output terminal comprising:

a power source that includes a high voltage rail and a low voltage rail;

a dual function reference voltage generator and amplifier circuit that generates a first gain signal which is responsive to a difference between a reference voltage and a feedback voltage, said dual function reference voltage and amplifier circuit including a series connection of a first depletion mode MOS transistor and a first enhancement mode MOS transistor between said high voltage rail and said low voltage rail, said first depletion mode MOS transistor having interconnected gate and source electrodes, said first enhancement mode MOS transistor having a gate connected to receive said feedback voltage;

a pass transistor having a first electrode connected to said high voltage rail, a second electrode connected to said output terminal, and a control electrode which is responsive to said first gain signal; and a feedback path connected to said dual function reference voltage generator and amplifier circuit to provide said feedback voltage, said feedback voltage having a magnitude that is responsive to an output voltage at said output terminal.

6. The circuit of claim 5 wherein said dual function reference voltage generator and amplifier circuit further includes a second depletion mode MOS transistor and a second enhancement mode MOS transistor, said second depletion mode MOS transistor connected in series between said high voltage rail and said first depletion mode MOS transistor such that gates of both depletion mode MOS transistors are coupled, said second enhancement mode MOS transistor connected in series between said first depletion mode MOS transistor and said first enhancement mode MOS transistor such that gates of both enhancement mode MOS transistors are coupled.

7. The circuit of claim 6 further comprising a second gain stage means for generating a second gain signal which is responsive to a difference between said feedback voltage and said first gain signal, wherein said second gain stage means includes two current paths between said high voltage rail and said low voltage rail such that a first current path includes a series connection of first, second, and third MOS transistors and a second current path includes a series connection of fourth, fifth, and sixth MOS transistors, said first and fourth MOS transistors forming a current mirror, said second and third MOS transistors having coupled gates and being connected to said feedback path, said fifth and sixth MOS transistors having coupled gates and being connected to said dual function reference voltage generator and amplifier circuit for receiving said first gain signal.

8. The circuit of claim 7 wherein said first, second and third MOS transistors on said first current path have substantially the same geometries as said fourth, fifth and sixth MOS transistors on said second current path such that when said feedback voltage equals said reference voltage, currents through said first and second current paths are equivalent.

9. The circuit of claim 7 further comprising a voltage divider connected in series between said output terminal and said low voltage rail, said voltage divider being connected to said feedback path.

10. The circuit of claim 9 wherein said voltage divider is two resistors connected in series, said feedback path being connected at a junction between said two resistors.

11. The circuit of claim 5 wherein said pass transistor is a PMOS transistor.

12. An efficient voltage regulator having an output terminal comprising:

a power source that includes a high voltage rail and a low voltage rail;

a reference voltage generating circuit including a series connection of a first depletion MOS transistor and a first enhancement mode MOS transistor between said high voltage rail and said low voltage rail, said first depletion mode MOS transistor having a gate connected to its source, said first enhancement mode MOS transistor having a gate connected to its drain, said reference voltage generator circuit having an output of a reference voltage, said reference voltage further including a second depletion mode MOS transistor and a second enhancement mode MOS transistor, said second depletion mode MOS transistor connected in series between said high voltage rail and said first depletion mode MOS transistor such that gates of both depletion mode MOS transistors are coupled, said second enhancement mode MOS transistor connected in series between said first depletion mode MOS transistor and said first enhancement mode MOS transistor such that gates of both enhancement mode MOS transistors are coupled;

an error amplifier means, connected to said reference voltage generator circuit, for generating an error signal that represents a difference between a reference current that is responsive to said reference voltage and a feedback current that is responsive to an output voltage at said output terminal;

a pass transistor having a first electrode connected to said high voltage rail, a second electrode connected to said output terminal, and a control electrode which is responsive to said error signal, said output voltage thereby being responsive to said error signal; and a feedback path connected to said error amplifier means to provide a feedback voltage, said feedback voltage being responsive to said output voltage.

13. The circuit of claim 12 wherein said error amplifier means includes two current paths between said high voltage rail and said low voltage rail such that a first current path includes a series connection of a first, a second, and a third MOS transistor and a second current path includes a series connection of a fourth, a fifth, and a sixth MOS transistor, said first and fourth MOS transistors forming a current mirror, said second and third MOS transistors being coupled at gates and connected to said feedback path, said fifth and sixth MOS transistors being coupled at gates and connected to said reference voltage generator circuit to receive said output of said reference voltage.

14. The circuit of claim 13 wherein said transistor geometries on said first current path are substantially identical to transistor geometries on said second current path such that when said feedback voltage equals said reference voltage, currents through said first and second current paths are equivalent.

15. The circuit of claim 12 further comprising a voltage divider connected in series between said output terminal and low voltage rail, said voltage divider being connected to said feedback path.

16. The circuit of claim 15 wherein said voltage divider is two resistors connected in series, said feedback path being connected to a junction between said two resistors.

17. The circuit of claim 12 wherein said pass transistor is a PMOS transistor.

18. The circuit of claim 14 further comprising a first and a second stabilization path, said first stabilization path including a first capacitor and connecting said output terminal to said second current, said second stabilization path including a second capacitor and an electrical resistance in series and connecting said second current path to said first current path.

* * * * *